(12) United States Patent
Bao et al.

(10) Patent No.: US 7,109,119 B2
(45) Date of Patent: Sep. 19, 2006

(54) SCUM SOLUTION FOR CHEMICALLY AMPLIFIED RESIST PATTERNING IN CU/LOW K DUAL DAMASCENE

(75) Inventors: Tien-I Bao, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 267 days.

(21) Appl. No.: 10/285,021

(22) Filed: Oct. 31, 2002

(65) Prior Publication Data

US 2004/0087164 A1 May 6, 2004

(51) Int. Cl.
*H01L 21/311* (2006.01)
(52) U.S. Cl. .................. 438/700; 438/702; 438/703
(58) Field of Classification Search ................ 438/636, 438/637, 638, 700, 702, 703, 692
See application file for complete search history.

(56) References Cited

U.S. PATENT DOCUMENTS

| | | | | |
|---|---|---|---|---|
| 5,846,884 A * | 12/1998 | Naeem et al. | .............. | 438/714 |
| 5,922,516 A | 7/1999 | Yu et al. | .................... | 430/314 |
| 6,042,999 A * | 3/2000 | Lin et al. | .................... | 430/316 |
| 6,103,456 A * | 8/2000 | Tobben et al. | .............. | 430/317 |
| 6,184,128 B1 | 2/2001 | Wang et al. | ................ | 438/637 |
| 6,284,657 B1 * | 9/2001 | Chooi et al. | ................ | 438/687 |
| 6,319,821 B1 * | 11/2001 | Liu et al. | .................... | 438/636 |
| 6,340,435 B1 | 1/2002 | Bjorkman et al. | ............ | 216/72 |
| 6,458,705 B1 * | 10/2002 | Hung et al. | ................ | 438/692 |
| 6,521,542 B1 * | 2/2003 | Armacost et al. | ........... | 438/712 |
| 6,720,256 B1 * | 4/2004 | Wu et al. | .................... | 438/638 |
| 2005/0006340 A1 | 1/2005 | Bao, et al. | | |

* cited by examiner

*Primary Examiner*—Kin-Chan Chen
(74) *Attorney, Agent, or Firm*—Haynes and Boone, LLP

(57) ABSTRACT

An improved method of patterning photoresist is described that is resistant to poisoning from nearby nitrogen containing layers. An inert resin is used to fill a via in a damascene stack. Then a second stack comprised of a barrier layer, a BARC, and a photoresist are formed on the damascene stack. The barrier layer is preferably an i-line or Deep UV photoresist comprising a polymer with hydroxy groups that can attract nitrogen containing compounds and prevent them from diffusing into the photoresist and causing scum during the patterning step. The photoresist pattern is etch transferred through underlying layers to form a trench in the damascene stack. Optionally, the resin is replaced by the barrier layer which fills the via and forms a planar layer on the damascene stack. The barrier layer is independent of exposure wavelength and can be readily implemented into manufacturing and is extendable to future technologies.

31 Claims, 7 Drawing Sheets

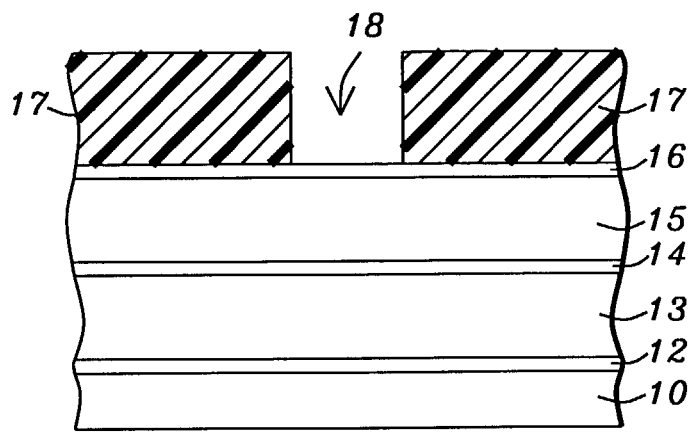
*FIG. 1a – Prior Art*
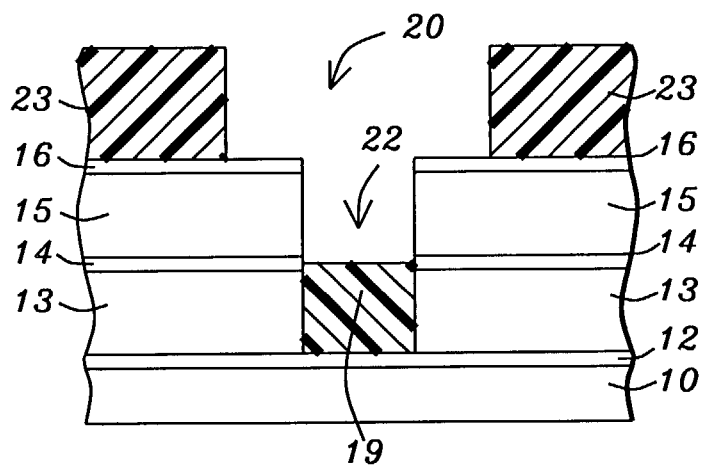
*FIG. 1b – Prior Art*
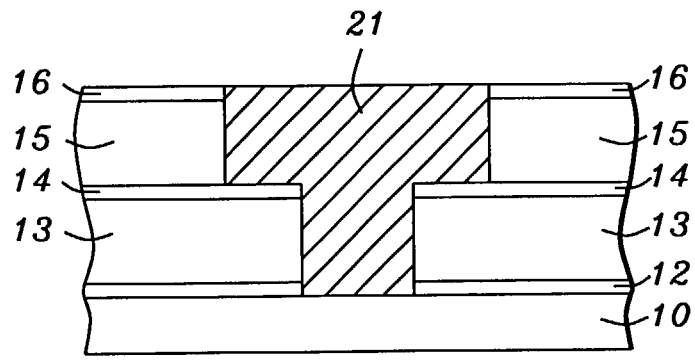
*FIG. 1c – Prior Art*

SCUM SOLUTION FOR CHEMICALLY AMPLIFIED RESIST PATTERNING IN CU/LOW K DUAL DAMASCENE

FIELD OF THE INVENTION

The invention relates to the field of fabricating integrated circuits and other electronic devices and in particular to an improved method of photoresist patterning that provides a scum free process during the formation of dual damascene structures.

BACKGROUND OF THE INVENTION

The manufacture of integrated circuits in a semiconductor device involves the formation of a sequence of layers that are categorized by their location in the front end of the line (FEOL) or in the back end of the line (BEOL). In BEOL processing, metal interconnects and vias form horizontal and vertical connections between layers and these metal lines are separated by insulating or dielectric materials to prevent crosstalk between the metal wiring. A popular method of forming an interconnect structure is a dual damascene process in which vias and trenches are filled with metal in the same step. Recent achievements in dual damascene processing include lowering the resistivity of the conductive metal by switching from aluminum to copper, decreasing the size of the vias and trenches with improved lithographic materials and processes, and reducing the dielectric constant of insulating materials to avoid capacitance coupling between conductive lines.

A lithography method in which a pattern on a mask is transferred into a photoresist on a substrate with an exposure step is typically used to define vias and trenches in the dual damascene structure. While most photoresists are optimized for FEOL applications that generally have smaller feature sizes or critical dimensions (CD) than BEOL layers, BEOL processes have unique challenges that require special solutions in some cases. For example, when forming a trench in a dual damascene structure, the lithography process usually must contend with considerable topography where the photoresist coating covers a planar surface and also fills a via hole. Furthermore, the imaging process can be negatively affected by solvents or amines in the dielectric materials that form the side of a via hole.

There is an ever present demand for smaller trench widths to be formed in order for devices with higher performance to be built. From a photoresist standpoint, a smaller CD is more easily printed when the film thickness is reduced or the exposure wavelength is decreased according to the equation $R = k\lambda/NA$. R is the minimum CD that can be resolved while k is a process constant, $\lambda$ is the exposure wavelength, and NA is the numerical aperture of the exposure tool. Thinner films help to lower k on a planar substrate but when forming a trench over a via hole in a dual damascene process, a thin photoresist film is not effective because the resulting nonplanar coating will cause problems in controlling the width of the trench above the via.

A bilayer concept has been introduced in an attempt to overcome the difficulties associated with imaging a thin single layer of photoresist over topography. Typically, the top layer in a bilayer scheme is a thin film of photoresist containing a small percentage of an element like silicon that can easily form an oxide in an oxygen plasma. The bottom layer is thicker so that it can form a planar surface over topography and often contains highly absorbing material that minimizes reflectivity to improve top layer patterning.

In theory, the thin photosensitive layer on a planar underlayer should provide a path to forming a small trench over a via hole in a dual damascene structure. However, a lack of maturity in silicon containing bilayer resists has prevented widespread acceptance in the industry.

An option in the bilayer approach is to expose a silicon free photoresist layer over an underlayer and then selectively introduce a silicon reagent into either the exposed or unexposed regions. This method of treating a photosensitive film with a silicon compound that reacts to become incorporated into the film is called silylation. In U.S. Pat. No. 5,922,516, the underlayer is a photoresist that has been thermally crosslinked at a temperature between 110° C and 140° and a silicon compound in a vapor phase reacts with the top resist. However, selective incorporation of the silicon into either exposed or unexposed regions is difficult to achieve. A lack of maturity in silylation tools is another concern for this technique.

Another issue associated with photoresist processing is the process latitude of forming a pattern. It is important for a lithography process to have a large depth of focus (DOF) and a wide exposure latitude when implemented in manufacturing in order to reduce cost. DOF refers to the range of focus settings on the exposure tool that enable a feature to be printed within a specified tolerance, generally ±10% of a targeted linewidth or space width. Exposure latitude is the range of exposure doses that maintain the feature size within the ±10% specification. Variable reflectivity of the exposing radiation off the substrate must be controlled in order to achieve the feature size specification. One widely used technique is to form an anti-reflective coating on the substrate before coating the photoresist film. This bottom anti-reflective coating (BARC) is usually about 300 to 1000 Angstroms thick and is baked above 200° C. so that it does not interact with the photoresist by mixing with or outgassing into the overlying layer. These thin BARCs are employed when the substrate is relatively flat and have been tuned so that their refractive indices match a particular family of photoresists. For example, one type of BARC is available for 193 nm photoresists and another type has been developed to improve imaging of Deep UV photoresists. Once the photoresist pattern is formed, it must be transferred with an etch process through the ARC.

In order to achieve finer resolution in photoresist patterns, the exposing wavelength ($\lambda$) has been steadily shifting lower in recent technology generations or nodes. Above the quarter micron (250 nm) generation, i-line (365 nm) or g-line (436 nm) exposure tools are more popular because of a lower cost of ownership. For the 130 nm to 250 nm nodes, Deep UV (248 nm) exposure tools have been implemented as state of the art. Meanwhile, 193 nm exposure tools are thought to be the best solution for reaching the 100 nm node and a 157 nm technology is being developed for the 70 nm node.

With the shift to 248 nm and 193 nm wavelengths, a new lithography concept was introduced in which photoresists operate by a chemical amplification mechanism whereby one molecule of strong acid is capable of causing hundreds of chemical reactions in an exposed film. A strong acid is generated by exposing a photosensitive component and the acid reacts with acid labile groups on a polymer in positive tone photoresist. In negative tone photoresist, the acid initiates a crosslinking reaction. This enables a higher photosensitivity (faster photospeed) that increases throughput compared to the old mechanism where one photon caused one chemical event in the photoresist film. It should be noted that in positive tone photoresists, the exposed regions are washed away in an aqueous base developer while in negative tone photoresists the unexposed regions are washed away in the developer solution.

Unfortunately, this new chemically amplified approach is quite sensitive to traces of base compounds such as airborne amines or amines that diffuse into the chemically amplified photoresist from adjacent or underlying layers. Sometimes, amine concentrations as low as parts per billion (ppb) can inhibit or "poison" the chemically amplified reaction enough to prevent a pattern from being formed. At other times, the poisoning is less severe and appears as scum on the substrate where a thin film of photoresist is not washed away in exposed (positive tone) or unexposed (negative tone) regions. Even mild cases of scumming can be difficult to remove by further processing and as a result the substrate must be reworked by stripping the photoresist, recoating and re-exposing. Rework is expensive and a better alternative is to implement a photoresist process that does not form scum.

A prior art method of forming a dual damascene structure as described in U.S. Pat. No. 6,319,821 is shown in FIGS. 1a–1c. In FIG. 1a, an opening 18 has been formed in photoresist 17 on a stack consisting of passivation layer 16, dielectric layers 13 and 15, etch stop layers 12 and 14, and substrate 10. Etch stop layers 12 and 14 are comprised of a material like $Si_3N_4$ while passivation layer 16 which relieves stress in phosphosilicate dielectric layer 15 is a material such as $SiO_xN_y$. The opening 18 is etch transferred through underlying layers 13, 14, 15, and 16 to form a via hole 22. After photoresist 17 is stripped, a second photoresist 19 that is an i-line (365 nm) sensitive material is coated to fill via hole 22. Photoresist 19 is etched back to a level that is coplanar with etch stop 14. Then a Deep UV photoresist 23 is coated on passivation layer 16 and fills via hole 22 above photoresist 19. A trench opening 20 is formed by patterning photoresist 23 in FIG. 1b. Opening 20 is etch transferred through passivation layer 16 and dielectric layer 15. Photoresists 19 and 23 are then removed with a wet strip process and a metal layer 21 comprised of copper or aluminum is deposited to fill via 22 and trench 20 openings. After a planarization step, the completed damascene structure appears as illustrated in FIG. 1c. While this method reduces the effect of photoresist poisoning during trench formation by employing a chemical barrier that protects photoresist 23 from amines that might diffuse out of etch stop layers 12 and 14 and dielectric layer 13, it does not protect photoresist 23 from amines such as ammonia contained in dielectric layer 15 and passivation layer 16.

In another prior art example, U.S. Pat. No. 6,340,435 teaches how to perform selective etches of adjacent dielectric layers having different dielectric constants to form vertical and horizontal interconnects. However, the method does not mention how to overcome photoresist patterning concerns when forming trenches in dual damascene structures.

Another method of forming a dual damascene structure is found in U.S. Pat. No. 6,184,128. One key feature is that the trench pattern is formed on a dielectric layer that has not been patterned. In addition, an ultra thin photoresist of <1500 Angstroms is used for patterning. One drawback is that the photoresist can be coated on nitride layers that can be sources of amines which will contaminate chemically amplified resists. Since there is no BARC or chemical barrier layer between the photoresist and the nitride, there is a high likelihood of photoresist poisoning or scum formation.

Therefore, an improved patterning method for forming trenches in dual damascene structures is desirable in which the photoresist does not come in contact with any passivation layer, dielectric material or etch stop layer that might cause scum. Moreover, the method should not depend on immature silicon-containing photoresists in a bilayer scheme. It should avoid silylation techniques in which selective introduction of silicon into a film is difficult to control. The method should be easily implemented in manufacturing and be a low cost solution. Ideally, the method should be versatile by being applicable to all wavelengths of exposing radiation.

SUMMARY OF THE INVENTION

An objective of the present invention is to provide an improved-method of forming dual damascene structures with a photoresist patterning process that is resistant to poisoning from underlying layers and does not form scum or residue during trench patterning.

A further objective of the present invention is to provide a lithography method that is compatible with a wide variety of exposure tools and exposure wavelengths such as i-line (365 nm), Deep UV (248 nm), and ArF (193 nm) steppers and scanners. The method should also be extendable to the next generation of exposure systems including 157 nm, X-ray, extreme UV (EUV), and projection electron beam tools.

A still further objective of the present invention is to provide a photoresist patterning method that is compatible with a high throughput, low cost manufacturing process.

These objectives are achieved by implementing a barrier layer between the photoresist layer and a damascene stack having one or more via holes. This method is especially useful for the trench patterning step following a process that has formed via holes. In one embodiment, a dual damascene stack is built on a substrate by sequentially forming an etch stop layer, a dielectric layer, and a passivation layer. A via hole is formed in the passivation layer and dielectric layer by using a patterned photoresist layer as an etch mask. The photoresist is removed and an organic or inorganic polymer layer is deposited to fill the via hole. This resin layer is an inert plug that avoids the need to pattern a photoresist in the via hole.

Next a barrier layer is formed by preferably coating and baking an i-line or Deep UV photoresist on the substrate. A bottom anti-reflective film (BARC) is coated and baked on the barrier layer. Then a top layer is coated which is a state of the art photoresist that can provide the minimum CD required for the trench opening. The photoresist is typically a chemically amplified type in order to achieve a high throughput and minimum resolution for the trench opening. By preventing amines from one or more damascene layers from diffusing into the photoresist, the barrier layer enables a scum free process that minimizes expensive rework.

The damascene process continues by transferring the opening in the photoresist through the BARC, barrier layer, passivation layer and into the dielectric layer with conventional etch steps. The etch process also lowers the level of the resin layer in the via hole. The remaining resin in the via and the remaining organic barrier layer are stripped with a wet process. An optional inorganic barrier layer may be deposited as a liner in the trench and via before a metal such as copper or aluminum is deposited in the trench and via hole. A planarizing step that can include a chemical mechanical polish lowers the metal until it is coplanar with the planarization layer to complete the dual damascene structure.

In a second embodiment, a via is formed in the damascene stack as before but the resin layer is replaced by coating a barrier layer such as an i-line photoresist that fills the via hole and forms a planar layer on the passivation layer. A BARC is coated on the barrier layer and then a photoresist is coated and baked on the BARC. The barrier layer prevents amines that might be present in the etch stop or dielectric layer from diffusing into the photoresist layer and interfering with the chemical reaction initiated during a patternwise exposure.

The damascene process continues by transferring the opening in the photoresist through the BARC, barrier layer, passivation layer and into the dielectric layer with conventional etch steps. The etch process also lowers the level of the barrier layer in the via hole. The remaining barrier layer material in the via and on the passivation layer is stripped with a wet process. An optional inorganic barrier layer may be deposited as a liner in the trench and via before a metal such as copper or aluminum is deposited in the trench and via hole. A planarizing step that can include a chemical mechanical polish lowers the metal until it is coplanar with the planarization layer to complete the dual damascene structure.

In a third embodiment, a substrate is provided with a nitrogen containing layer formed thereon. A barrier layer, BARC, and photoresist layer are sequentially formed as in previous embodiments. An opening is formed in the photoresist and is etch transferred through the BARC, barrier layer, and nitrogen containing layer into the substrate. The BARC, barrier layer, and photoresist are stripped to leave a feature such as a via hole or trench in the substrate. In one example, the nitrogen containing layer may be a dielectric layer in a single damascene process that has trace amounts of an amine. Alternatively, the nitrogen containing layer may be comprised of silicon nitride or silicon oxynitride.

BRIEF DESCRIPTION OF THE DRAWINGS

FIGS. 1a–1c are cross sectional views depicting a prior art method of forming a dual damascene structure.

DETAILED DESCRIPTION OF THE INVENTION

Figure 2A:
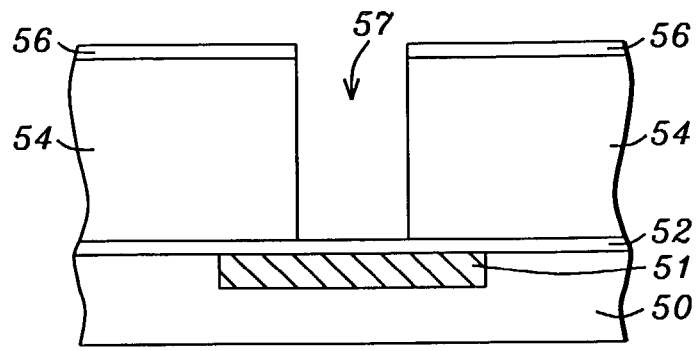
FIGS. 2a–2e are cross sectional views illustrating a photoresist patterning method and formation of a dual damascene structure according to the first embodiment of the present invention.
Figure 2B:
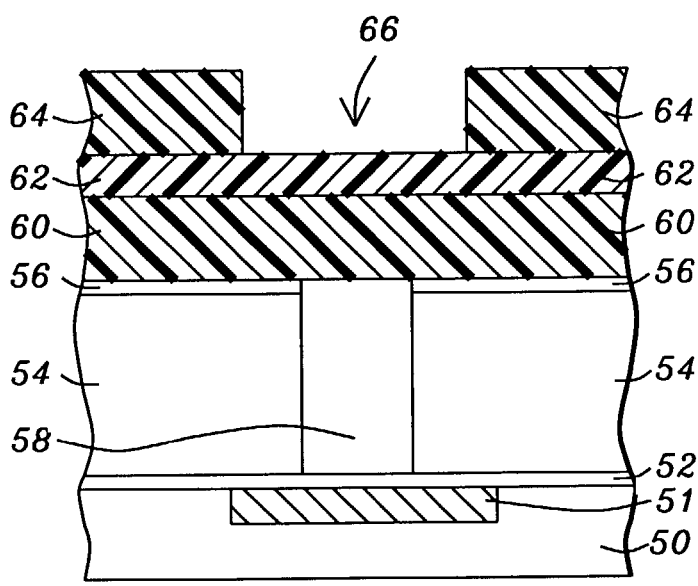

The present invention is particularly useful for photoresist patterning and transferring a pattern to form a dual damascene structure. The first embodiment is illustrated in FIGS. 2a–2e. Referring to FIG. 2a, a substrate 50 which is typically silicon but can be an alternative material like silicon/germanium (SiGe) or gallium/arsenide is provided with a substructure that includes a metal layer 51. Metal 51 is preferably aluminum or copper or an Al/Cu alloy. An etch stop layer 52 is deposited with a thickness of about 50 to 1000 Angstroms and is comprised of an oxide, carbide, or nitride such as $Si_3N_4$. Then a dielectric material is deposited or spin coated to give a 500 to 30000 Angstrom thick dielectric layer 54 on etch stop layer 52. The dielectric material 54 is selected from a group including $SiO_2$, carbon doped $SiO_2$, polyimides, polysilsesquioxanes, polyarylethers, fluorosilicate glass, and commercial materials such as FLARE from Allied Signal or SiLK from Dow Corning, and other low k dielectric compositions.

The top of the dielectric stack is then formed by depositing a passivation layer 56 which also relieves stress in dielectric layer 54. Passivation layer 56 can be $SiO_XN_Y$ or an inorganic oxide or nitride and has a thickness in the range of about 50 to 2000 Angstroms.

A via hole 57 as shown in FIG. 2a is formed in the damascene stack by patterning a photoresist layer (not shown) and then performing an anisotropic etch to transfer the opening in the photoresist through passivation layer 56 and dielectric layer 54. The photoresist is removed by a conventional wet strip process. A wet cleaning step can be added to ensure that no residues remain on passivation layer 56 or on exposed etch stop 52. A resin solution that includes an organic or inorganic polymer is then spin coated on the passivation layer 56 and baked at about 200° C. for 60 seconds to remove solvent and to fill via 57 and form a resin layer 58 on passivation layer 56. The bake temperature may be higher than 200° C. in order to cure resin layer 58 and prevent any outgassing during processing of overlying layers. Resin layer 58 is etched back to a level that is coplanar with passivation layer 56 so that layer 58 fills only via hole 57.

A stack of organic layers is then formed on passivation layer 56 and resin layer 58 and is comprised of a barrier layer 60, an anti-reflective coating (BARC) 62, and a photoresist 64. First, a barrier layer 60 which is a key feature of this invention is spin coated and baked in a temperature range from about 150° C. to about 200° C. for a period of about 20 to 500 seconds to form a film. Preferably, the barrier layer 60 is baked at a temperature that is equal to or greater than the processing temperatures of the BARC and photoresist. Barrier layer 60 preferably contains a polar component such as a polymer with hydroxyl or phenol groups that can attract or bond with amines or nitrogen containing compounds that might diffuse out of passivation layer 56 or through resin layer 58. Preferably, the barrier layer 60 is an i-line photoresist or a Deep UV photoresist. An i-line photoresist normally includes a Novolac resin that is prepared by reacting a cresol, xylenol, or other substituted phenols with formaldehyde. The inventors have found that i-line photoresists are particularly useful in preventing amines such as ammonia from reaching an overlying photoresist that is exposed to produce a pattern.

Deep UV photoresists are typically comprised of polymers having hydroxystyrene groups. The hydroxyl groups in both i-line and Deep UV polymers can form hydrogen bonds with amine compounds and prevent them from diffusing through the barrier layer. Barrier layer 60 can be formed from either a positive tone or negative tone photoresist. Since layer 60 is not exposed, it does not have to contain photosensitive components and can simply be a polar polymer. However, the material selected for layer 60 is conveniently one that is already used in the manufacturing line in order to avoid the cost of implementing new materials.

The thickness of barrier layer 60 is from 50 to 5000 Angstroms. The thickness of layer 60 must be great enough to prevent amines from migrating through the layer but preferably should not be thicker than an overlying photoresist layer 64. Photoresist 64 is later patterned and serves as an etch mask. Since photoresist 64 and barrier layer 60 are composed of similar materials, the etch selectivity is approximately 1:1. Preferably, the relative thickness of layers 64 and 60 is such that some photoresist 64 remains after the first etch transfer step through layer 60. Ideally, barrier layer 60 should be baked at a temperature equal to or greater than the processing temperatures of BARC 62 and photoresist 64 in order to avoid outgassing that can distort the film quality of the BARC 62 and photoresist 64.

BARC 62 is formed by spin coating a commercially available material from suppliers like Shipley Company, JSR, TOK, Hoechst, and Brewer. The thickness is generally between about 300 Angstroms and 1000 Angstroms. The BARC 62 can be baked at temperatures up to 225° C. in order to cure the film and make it immiscible with organic solvents used to coat photoresist 64. BARC 62 is selected so that its optical properties minimize reflectivity of light during exposure of photoresist 64. Therefore, the selection of a BARC 62 depends on the exposure wavelength required to form trench opening 66 in FIG. 2b. In other words, a Deep UV BARC 62 is matched with a Deep UV photoresist 64 and a 193 nm BARC 62 is matched with a 193 nm sensitive photoresist 64.

Selection of photoresist 64 depends upon the size of the trench opening 66. Usually, a Deep UV photoresist is preferred for printing feature sizes in a range from about 130 nm to about 250 nm and 193 nm photoresists are desired for printing features with a size between about 100 nm and 130 nm. Photoresists are available from suppliers including Shipley Company, Sumitomo, TOK, JSR, and Hoechst. The thickness of photoresist 64 is in a range from about 2000 Angstroms to about 8000 Angstroms depending on the width of opening 66.

Photoresist 64 is patternwise exposed and then developed in an aqueous base solution to form opening 66 and can be either a positive tone or negative tone material. Because BARC 62 controls reflectivity during exposure, vertical sidewalls can be achieved on opening 66. There is no foot or undercut at the base of the sidewalls on opening 66 since the BARC 62 has been baked at a high enough temperature so that it does not interact with photoresist 64. There is no scum or photoresist residue at the bottom of opening 66 that is caused by amines reacting with photoresist 64 since barrier layer 60 has prevented contaminants from migrating from layers 54 and 56 into photoresist 64. The inventors have discovered that BARC 62 by itself is ineffective in preventing scum from occurring during patterning of photoresist 64. Since many BARCs are comprised of relatively non-polar components, they do not attract polar nitrogen containing compounds like amines and are not efficient in stopping migration of amine contaminants into an overlying photoresist.

Figure 2C:
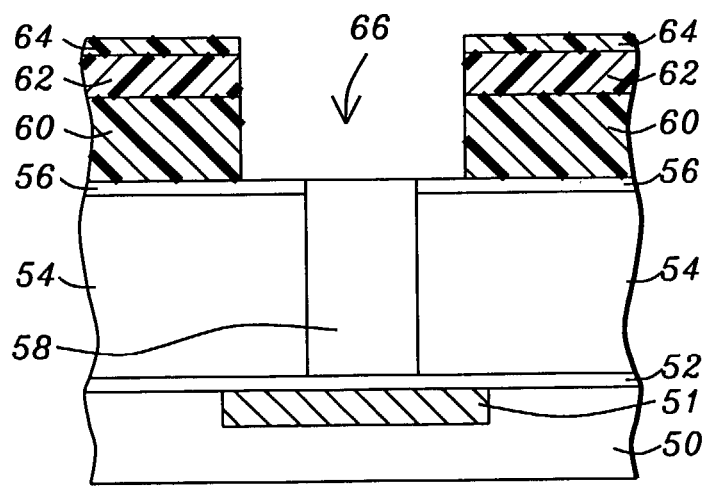

Referring to FIG. 2c, trench opening 66 is transferred through BARC 62 and barrier layer 60 in an etch chamber with an etch gas comprising $C_4F_8$ at a flow rate of about 1000 sccm.

Figure 2D:
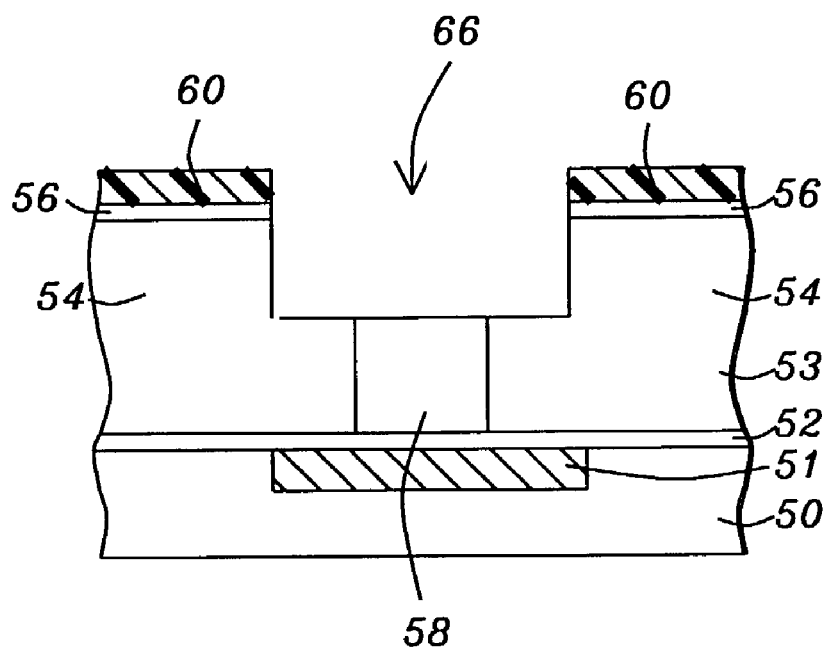

Referring to FIG. 2d, passivation layer 56 that has been exposed by opening 66 is then etched with a nitride etchant. In the case of $SiO_XN_Y$, a gas mixture of Ar, $CHF_3$, and $CF_4$ at flow rates of between about 50 to 150 sccm, 0 to 100 sccm, and 0 to 50 sccm, respectively, is used. Then dielectric layer 54 is etched with an oxide etchant to complete the trench 66 formation. When $SiO_2$ is the dielectric layer, an oxide etchant comprised of Ar, $CHF_3$ and $C_4F_8$ at flow rate of between about 10 to 150 sccm, 10 and 50 sccm, and 0 to 22 sccm, respectively, is used. Other dielectric materials can be etched with a gas mixture comprised of $O_2$, He, and $CF_4$ with flow rates of between about 10 to 250 sccm, 40 to 80 sccm, and 0 to 50 sccm, respectively. During the etch through layers 54 and 56, photoresist 64 and BARC 62 are typically consumed and a portion of barrier layer 60 is also removed. The level of resin layer 58 is also reduced.

Figure 2E:
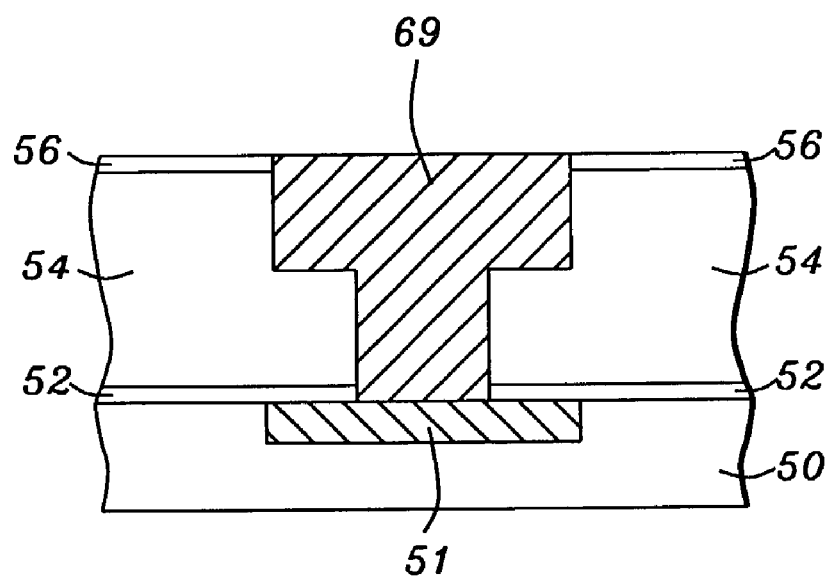

Referring to FIG. 2e, the remainder of resin layer 58 and barrier layer 60 are then stripped in a wet solution. One commonly used stripping mixture consists of 7 parts $H_2SO_4$ and 3 parts $H_2O_2$. An inorganic barrier layer (not shown) such as TiN can be deposited as a liner in trench opening 66 and in via hole 57 before a metal such as copper or aluminum is deposited to simultaneously fill via hole 57 and trench 66. Next, the level of metal 69 is lowered by a planarizing step such as a chemical mechanical polish (CMP) method until metal 69 is coplanar with passivation layer 56 and the dual damascene structure is completed.

Figure 3A:
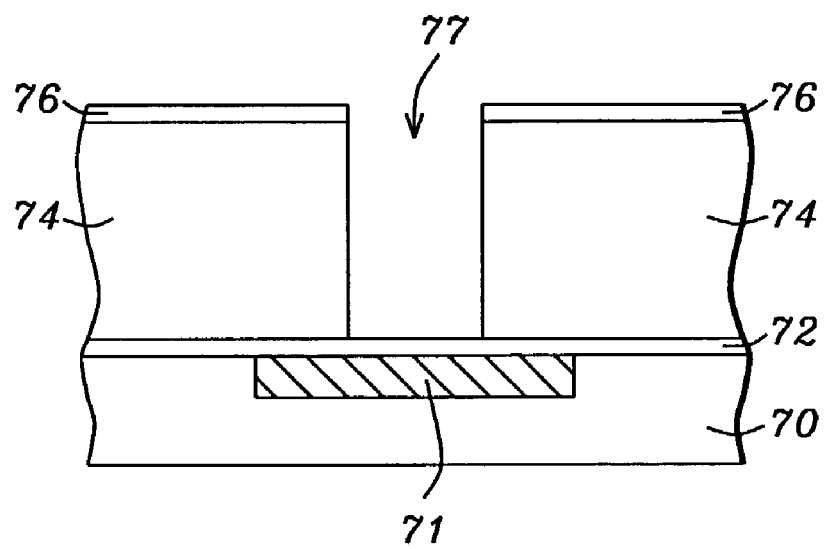
FIGS. 3a–3e are cross sectional views showing a photoresist patterning method and formation of a dual damascene structure according to the second embodiment of the present invention.
Figure 3B:
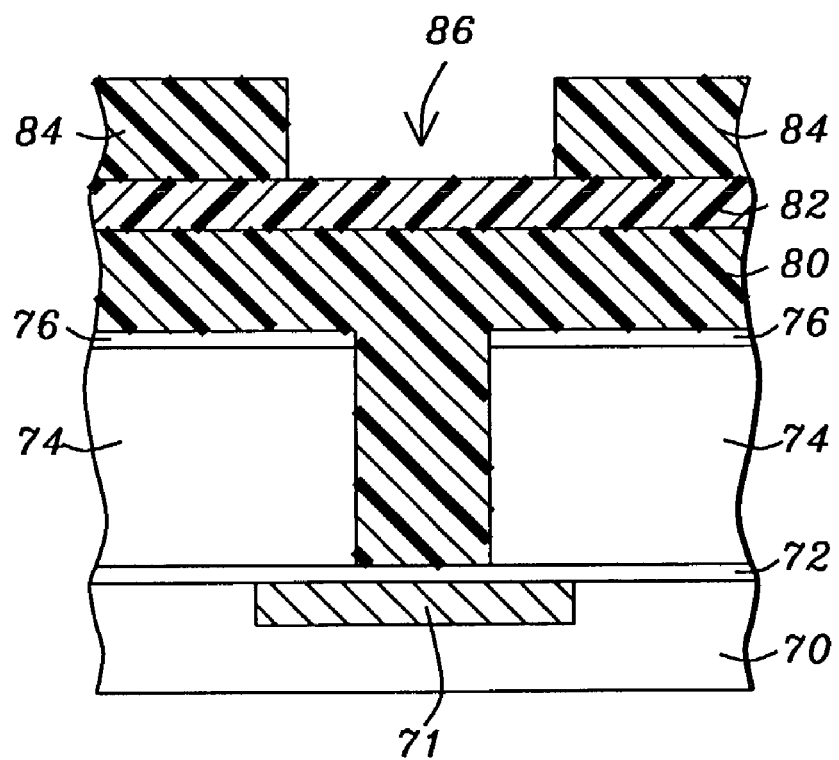

A second embodiment is illustrated in FIGS. 3a–3e. Referring to FIG. 3a, a substrate 70 is provided which is typically silicon but can be an alternative material like silicon/germanium (SiGe) or gallium/arsenide with a substructure that includes a metal layer 71. Metal 71 is preferably aluminum or copper or an Al/Cu alloy. An etch stop layer 72 is then deposited by a CVD method and has a thickness of about 50 to 1000 Angstroms and is comprised of an oxide, carbide or a nitride such as $Si_3N_4$. Then a dielectric material is deposited or spin coated to give a 500 to 30000 Angstrom thick dielectric layer 74. The dielectric material 74 is selected from a group including $SiO_2$, carbon doped $SiO_2$, polyimides, polysilsesquioxanes, polyarylethers, fluorosilicate glass, and commercial materials such as FLARE from Allied Signal or SiLK from Dow Corning, and other low k dielectric compositions. The top of the dielectric stack is then formed by depositing a passivation layer 76 which also relieves stress in dielectric layer 74. Passivation layer 76 can be $SiO_XN_Y$ or an inorganic oxide or nitride and has a thickness in the range of 50 to 2000 Angstroms.

Referring to FIG. 3a, a via hole 77 is formed in the damascene stack by patterning a photoresist layer (not shown) and then performing an anisotropic etch to transfer the opening in the photoresist through passivation layer 76 and dielectric layer 74. The photoresist is removed by a conventional wet strip process. A wet cleaning step can be added to ensure that no residues remain on passivation layer 76 or on etch stop 72.

Next, a stack of organic layers is formed on passivation layer 76 and is comprised of a barrier layer 80, an anti-reflective coating (BARC) 82, and a photoresist 84. First, a barrier layer 80 which is a key feature of this invention is spin coated and baked in a temperature range from about 150° C. to about 200° C. for a period of 20 to 500 seconds to form a film. Barrier layer 80 fills via hole 77 and forms a planar layer above passivation layer 76. Barrier layer 80 is preferably comprised of a polar component such as a polymer with hydroxyl or phenol groups that can attract or bond with amines that might diffuse out of passivation layer 76, dielectric layer 74, and etch stop layer 72.

Preferably, the barrier layer 80 is an i-line photoresist or a Deep UV photoresist. An i-line photoresist normally includes a Novolac resin that is prepared by reacting a cresol, xylenol, or other substituted phenols with formaldehyde. The inventors have found that i-line photoresists are particularly useful in preventing amines such as ammonia from reaching an overlying photoresist. Deep UV photoresists are typically comprised of polymers having hydroxystyrene groups. The hydroxy groups in both i-line and Deep UV polymers can form hydrogen bonds with amine compounds and prevent them from diffusing through the barrier layer. Barrier layer 80 can be formed from either a positive tone or negative tone photoresist. Since layer 80 is not exposed, it does not have to contain photosensitive components and can simply be a polar polymer. However, the material selected for layer 80 is conveniently one that is already used in the manufacturing line in order to avoid the cost of implementing new materials.

Figure 3C:
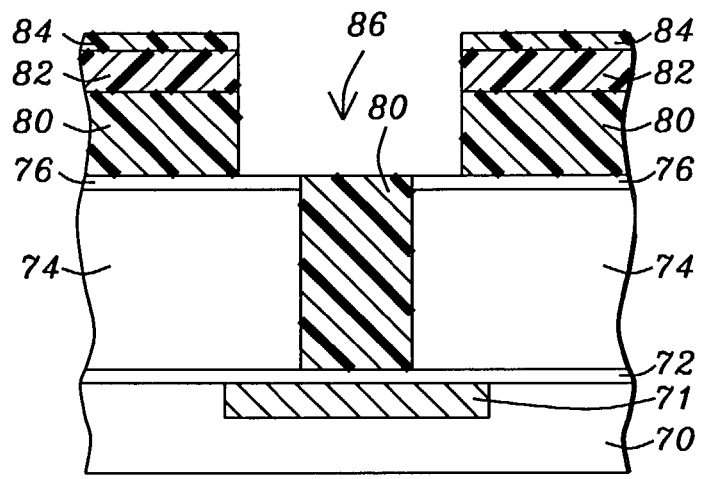

The thickness of barrier layer 80 above layer 76 is from 50 to 5000 Angstroms. The thickness of layer 80 must be great enough to prevent amines from migrating through the layer but preferably should not be thicker than an overlying photoresist layer 84. Photoresist 84 is later patterned and serves as an etch mask. Since photoresist 84 and barrier layer 80 are composed of similar materials, the etch selectivity is approximately 1:1. Preferably, the relative thickness of layers 84 and 80 is such that some photoresist 84 remains after the etch transfer step through layer 80 that stops on layer 76 as shown in FIG. 3c. Ideally, barrier layer 80 should be baked at a temperature equal to or greater than the processing temperatures of BARC 82 and photoresist 84 in order to avoid outgassing that can distort the film quality of the BARC 82 and photoresist 84. A high cure temperature will also prevent further shrinkage of barrier layer 80 which could cause it to become non-planar and decrease the process latitude for forming trench 86 in photoresist 84.

BARC 82 is formed by spin coating a commercially available material from suppliers like Shipley Company, JSR, TOK, Hoechst, and Brewer. The thickness is generally between about 300 Angstroms and 1000 Angstroms. The BARC 82 can be baked at temperatures up to 225° C. in order to cure the film and make it immiscible with organic solvents used to coat photoresist 84. BARC 82 is selected so that its optical properties minimize reflectivity of light during exposure of photoresist 84. Therefore, the selection of a BARC 82 depends on the exposure wavelength required to form trench opening 86 in FIG. 3b. In other words, a Deep UV BARC 82 is matched with a Deep UV photoresist 84 and a 193 nm BARC 82 is matched with a 193 nm sensitive photoresist 84.

Selection of photoresist 84 depends upon the size of the trench opening 86. Usually, a Deep UV photoresist is preferred for printing feature sizes in a range from about 130 nm to about 250 nm and 193 nm photoresists are desired for printing features with a size between about 100 nm and 130 nm. Photoresists are available from suppliers including Shipley Company, Sumitomo, TOK, JSR, and Hoechst. The thickness of photoresist 84 is in a range from about 2000 Angstroms to about 8000 Angstroms depending on the width of opening 86.

Photoresist 84 is patternwise exposed and then developed in an aqueous base solution to form opening 86 and can be either a positive tone or a negative tone composition. Because BARC 82 controls reflectivity during exposure, vertical sidewalls can be achieved on opening 86. There is no foot or undercut at the base of the sidewalls on opening 86 since the BARC 82 has been baked at a high enough temperature so that it does not interact with photoresist 84. There is no scum or photoresist residue at the bottom of opening 86 that is caused by amines reacting with photoresist 84 since barrier layer 80 has prevented contaminants from migrating from layers 74, and 76 into photoresist 84. The inventors have discovered that BARC 82 by itself is ineffective in preventing scum from occurring during patterning of photoresist 84. Since many BARCs are comprised of relatively non-polar components, they do not attract amines and are not efficient in stopping migration of amine contaminants into an overlying photoresist.

Referring to FIG. 3c, trench opening 86 is transferred through BARC 82 and barrier layer 80 in an etch chamber by a conventional etch method known to those skilled in the art.

Figure 3D:
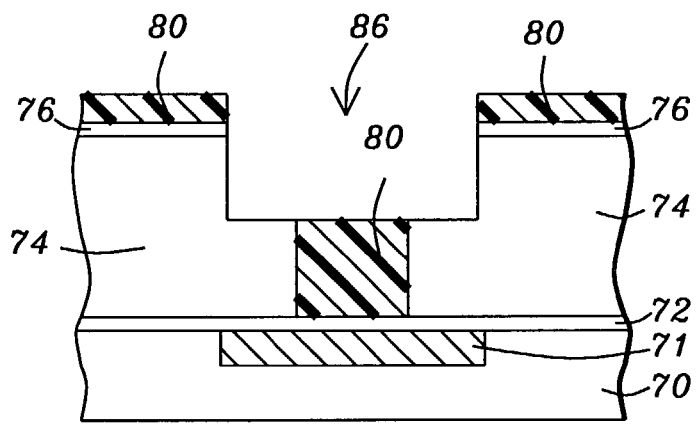

Referring to FIG. 3d, passivation layer 76 that has been exposed by opening 86 is then etched with a nitride etchant. In the case of $SiO_xN_y$, a gas mixture of Ar, $CHF_3$, and $CF_4$ with flow rates of between about 50 to 150 sccm, 0 to 100 sccm, and 0 to 50 sccm, respectively, is used. Then dielectric layer 74 is etched with an oxide etchant to complete the trench 86 formation. When $SiO_2$ is the dielectric layer, an oxide etchant comprised of Ar, $CHF_3$ and $C_4F_8$ with flow rates of between about 10 to 150 sccm, 10 and 50 sccm, and 0 to 22 sccm, respectively, is used. Other dielectric materials can be etched with a gas mixture comprised of $O_2$, He, and $CF_4$ with flow rates of between about 10 to 250 sccm, 40 to 80 sccm, and 0 to 50 sccm, respectively. During the etch through layers 74 and 76, photoresist 84 and BARC 82 are typically consumed and the level of barrier layer 80 in via hole 77 is reduced.

Figure 3E:
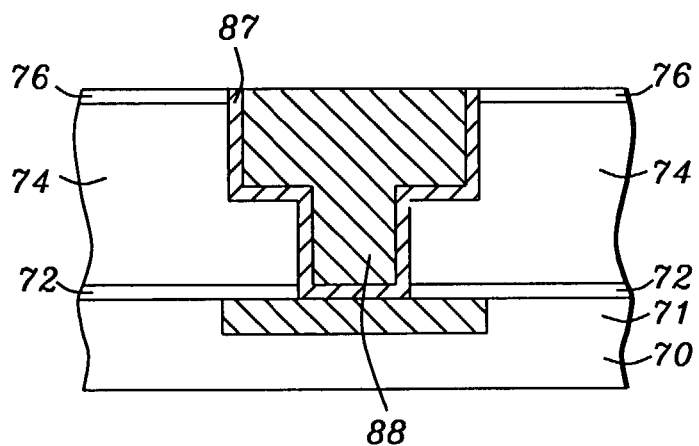

Referring to FIG. 3e, the remainder of barrier layer 80 on passivation layer 76 and barrier layer 80 in via hole 77 is then stripped in a wet solution. One commonly used stripping mixture consists of 7 parts $H_2SO_4$ and 3 parts $H_2O_2$. An inorganic barrier layer 87 such as TiN can be deposited as a liner in trench opening 86 and in via hole 77 before a metal 88 such as copper or aluminum is deposited to simultaneously fill via hole 77 and trench 86. Next, the level of metal 88 is reduced by a planarizing step such as a CMP method until metal 88 is coplanar with passivation layer 76 to complete the dual damascene structure.

Thus, a versatile method of patterning a dual damascene structure has been described in which a photoresist and BARC are selected from existing materials in the manufacturing line and the photoresist is exposed with the appropriate exposure wavelength to provide a trench opening of the required size and process latitude. The barrier layer is independent of exposure tool or exposing wavelength and is extendable to future technologies involving shorter wavelengths of light and alternate exposure methods such as 157 nm, projection electron beam, X-ray, and EUV systems. The barrier layer is more effective than other materials such as BARCs in preventing amines from underlying layers from diffusing into the photoresist and causing scum that is expensive to remove. The method of the present invention is less costly than bilayer or silylation techniques that require new materials or new tools. The barrier layer is selected from existing materials in the manufacturing line such as i-line or Deep UV photoresists in order to avoid the cost of implementing new materials. Either positive tone or negative tone photoresists can be used as the top photoresist layer or as the barrier layer to provide flexibility in the manufacturing process. The method can be readily implemented since it relies on existing materials, tools and processes.

Figure 4A:
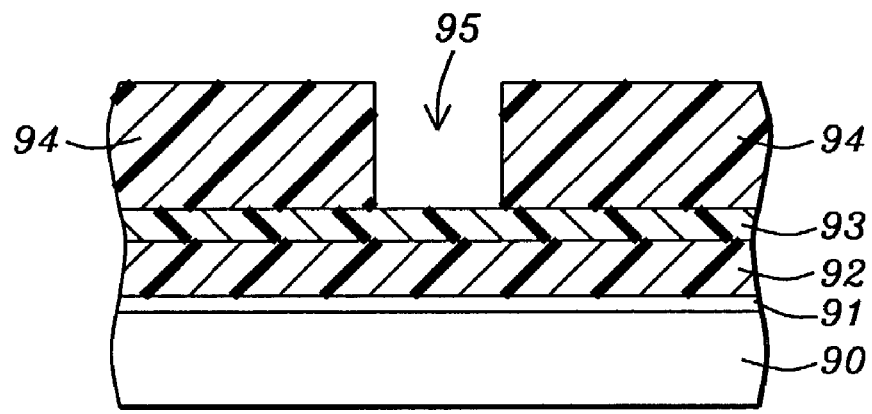
FIGS. 4a–4b are cross-sectional views of a photoresist patterning method according to a third embodiment of the present invention.
Figure 4B:
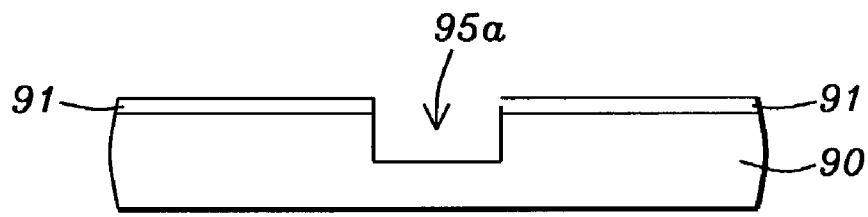

A third embodiment is illustrated in FIGS. 4a–4b. In FIG. 4a, a substrate 90 is provided which may have a substructure comprising conducting and insulating layers (not shown). A nitrogen containing layer 91 such as silicon nitride or silicon oxynitride is formed on the substrate by a CVD or other commonly used deposition process. An alternative material for layer 91 is a dielectric layer that has trace amounts of a nitrogen containing compound like an amine.

Next a barrier layer 92 is formed on nitrogen containing layer 91. Barrier layer 92 is preferably comprised of a polar component such as a polymer with hydroxyl or phenol groups that can attract or bond with amines that might diffuse out of layer 91. Preferably, the barrier layer 92 is an i-line photoresist or a Deep UV photoresist and can be either a positive tone or negative tone photoresist. Since layer 92 is not exposed, it does not have to contain photosensitive components and can simply be a polar polymer. However, the material selected for layer 92 is conveniently one that is already used in the manufacturing line in order to avoid the cost of implementing new materials.

A bottom anti-reflective film (BARC) 93 is formed on barrier layer 92 by coating a commercially available material and is typically baked at temperatures up to 225° C. in order to cure the film and make the BARC 93 immiscible with organic solvents used to coat photoresist 94 in a subsequent step. BARC 93 is selected so that its optical properties minimize reflectivity of light during exposure of photoresist 94. Therefore, the selection of a BARC 93 depends on the exposure wavelength required for a subsequent patterning step.

Selection of photoresist 94 depends upon the size of the opening 95 that will be transferred into substrate 90. Usually, a Deep UV photoresist is preferred for printing feature sizes in a range from about 130 nm to about 250 nm and 193 nm photoresists are desired for printing features with a size between about 100 nm and 130 nm. Photoresist 94 can be either a positive tone or negative tone composition and is patternwise exposed and then developed in an aqueous base solution to form opening 95. There is no scum or photoresist residue at the bottom of opening 95 that would be caused by amines reacting with photoresist 94 since barrier layer 92 has prevented contaminants from migrating from nitrogen containing layer 91 into photoresist 94. The inventors have discovered that BARC 93 by itself is ineffective in preventing scum from occurring during patterning of photoresist 94. Therefore, the present invention is an improvement over prior art methods that involve a photoresist on a BARC which is coated directly on a nitrogen containing layer.

Referring to FIG. 4b, opening 95 in FIG. 4a is transferred through BARC 93, barrier layer 92, nitrogen containing layer 91 and into substrate 90 by one or more etch steps known to those skilled in the art to afford opening 95a. Any remaining photoresist 94, BARC 93, and barrier layer 92 is stripped by conventional methods. Optionally, nitrogen containing layer 91 may also be removed if it is not a permanent part of the device.

This method provides a wider process latitude for printing an opening 95 in a photoresist than prior art processes since scum which can minimize a process window is avoided. When layer 91 is a dielectric layer, this embodiment encompasses a single damascene technique and may be further comprised of removing the exposed etch stop layer at the bottom of opening 95a, and depositing a barrier metal layer and metal layer in opening 95a as shown in FIG. 4b to fabricate an interconnect.

EXAMPLE 1

Figure 5A:
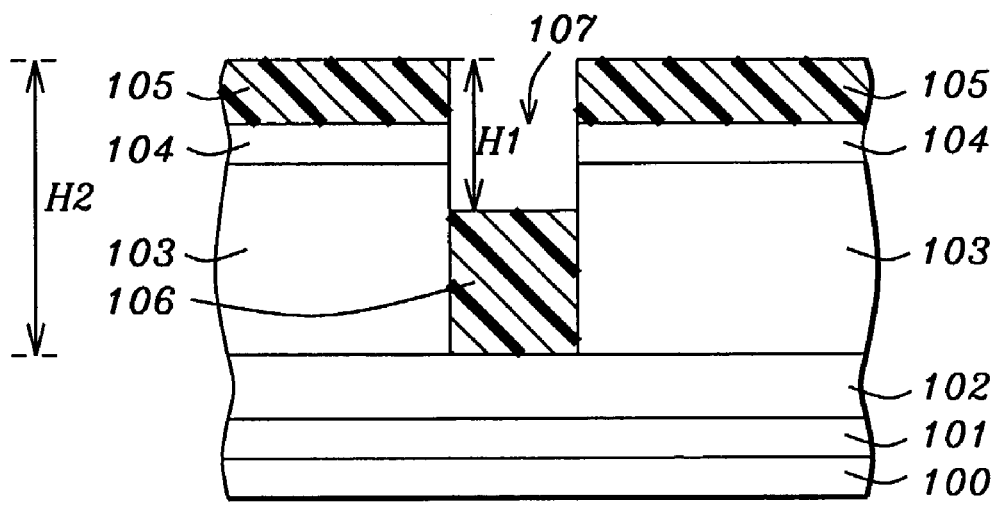
FIGS. 5a–5c are cross sectional views of a patterning sequence in which the effectiveness of a barrier layer in reducing scum can be determined.
Figure 5B:
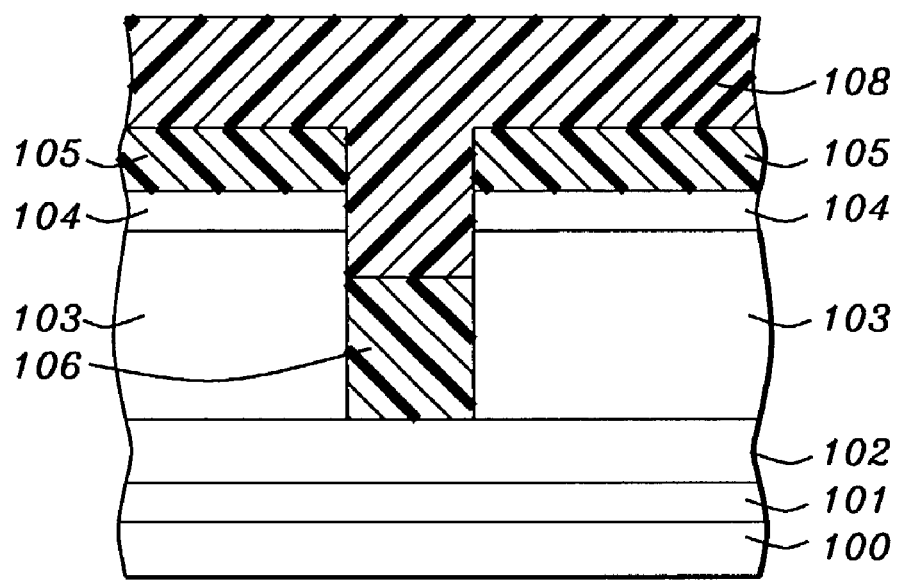
Figure 5C:
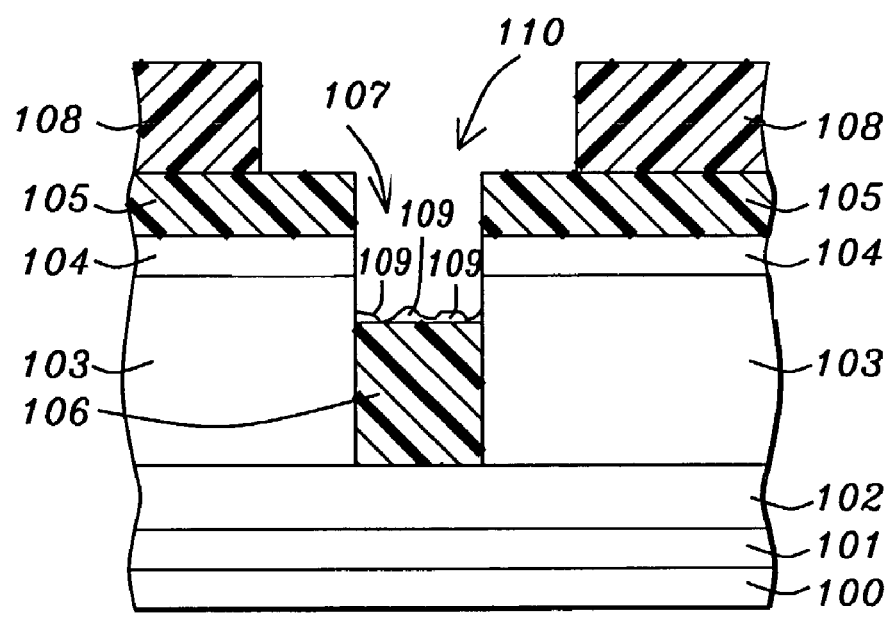

The effectiveness of an i-line photoresist as a barrier layer to prevent scumming during patterning of an overlying photoresist was demonstrated according to the following experiment depicted in FIGS. 5a–5c. A substrate 100 is provided with a stack of layers formed thereon. First a silicon carbide film 101 is deposited with a thickness of 500 Angstroms. A tetraethoxyorthosilicate (TEOS) layer 102 of about 300 Angstroms is then deposited by a CVD method on the SiC layer 101. Next a nitrogen containing low k dielectric material is deposited to form a 5000 Angstrom thick dielectric layer 103. Another 300 Angstrom thick TEOS layer 104 is then deposited with a CVD method. An anti-reflective film (BARC) 105, preferably a non-nitrogen containing material, is then formed on TEOS layer 104.

A Deep UV photoresist is spin coated on BARC 105 and baked to form a 5000 Angstrom thick film (not shown). The photoresist is exposed with an ASML stepper and developed in aqueous base to form a via hole opening in the photoresist. The opening is etch transferred through BARC 105, TEOS layers 104 and 102 and through dielectric layer 103 to form via hole 107 in FIG. 5a. After the patterned photoresist is stripped, a resin solution is then spin coated on BARC 105 and baked at a temperature of 200° C. for 60 seconds to form a plug fill 106. Plug fill 106 is etched in a chamber with a pressure of 10 mTorr, a power of 600 Watts, a $N_2$ flow rate of 200 sccm, an $O_2$ flow rate of 500 sccm and an Ar flow rate of 300 sccm. The etch lowers the level of resin in plug fill 106 to below the top of BARC layer 105 by a distance $H_1$ as shown in FIG. 5a. The total height of the via hole 107 is $H_2$.

Next a chemically amplified Deep UV photoresist is coated on BARC 105 and is baked to form a 5000 Angstrom thick film 108 as shown in FIG. 5b. Photoresist 108 also fills via 107 to a depth of $H_1$. Photoresist 108 is then patternwise exposed on an ASML stepper at a dose of about 60 mJ/Cm$^2$, post expose baked, and developed in 2.38% aqueous tetrabutylammonium hydroxide (TBAH) for 60 seconds to form an opening 110. The region above plug fill 106 is included in the exposed region and is removed by TBAH developer to a depth $H_1$. In some cases, residue or scum 109 remains in via hole 107 as shown in FIG. 5c because nitrogen containing compounds have diffused out of dielectric layer 103 and inhibited the chemically amplified reaction that was initiated by exposing photoresist 108. When the height ($H_2-H_1$) of plug fill 106 is 70% or 90% of $H_2$, no scum 109 is formed in via 107. However, when the height ($H_2-H_1$) of plug fill 106 is <50% of $H_2$ and photoresist 108 comes in contact with dielectric layer 103, then scum 109 is observed in via hole 107. Therefore, when plug fill 106 is between photoresist 108 and dielectric layer 103, scum formation during the patterning process of photoresist 108 is prevented. In this case, the plug fill is a polymer but a fill such as a baked i-line photoresist is equally effective in preventing scum formation during patterning of photoresist 108 in via hole 107.

While this invention has been particularly shown and described with reference to, the preferred embodiments thereof, it will be understood by those skilled in the art that various changes in form and details may be made without departing from the spirit and scope of this invention.

We claim:

1. A damascene method comprising:
   providing a substrate with a first stack of layers formed thereon, said first stack comprised of a lower etch stop layer, a middle dielectric layer, maid an upper passivation layer wherein one or more of said layers is comprised of a nitrogen containing compound;
   forming a via hole in said passivation and dielectric layers;
   filling said via hole with a resin;
   forming a second stack of layers upon said first stack, said second stack is comprised of a lower barrier layer, a middle anti-reflective film (BARC), and an upper photoresist layer, said barrier layer being made from a material that is different from the material of said BARC and the material of said passivation layer;
   patterning said photoresist to form a trench; and
   transferring said pattern into at least a portion of said first stack.

2. The method of claim 1 wherein said etch stop layer is selected from a group including silicon carbide, silicon nitride, and silicon oxynitride.

3. The method of claim 1 wherein said passivation layer is selected from a group of materials including oxides and nitrides and is preferably $SiO_xN_y$.

4. The method of claim 1 wherein said dielectric layer is selected from a group of materials including $SiO_2$, carbon doped $SiO_2$, polyimides, polysilsesquioxanes, polyarylethers, and fluorosilicate glass.

5. The method of claim 1 wherein said resin is selected from a group of materials including organic and inorganic polymers.

6. The method of claim 5 wherein said resin layer is etched so that it is approximately coplanar with said passivation layer prior to coating said barrier layer.

7. The method of claim 1 wherein said barrier layer is spin coated and baked at a temperature equal to or above the processing temperatures of said BARC and photoresist layers.

8. The method of claim 1 wherein said barrier layer is an i-line photoresist or a Deep UV photoresist comprised of a polymer having hydroxyl groups.

9. The method of claim 8 wherein said photoresist is a positive tone or negative tone photoresist.

10. The method of claim 1 wherein said barrier layer is from between 50 Angstroms and 5000 Angstroms thick.

11. The method of claim 1 wherein the BARC and photoresist are selected for patterning with an exposure wavelength that is preferably sub-200 nm.

12. The method of claim 11 wherein the BARC is baked at a temperature of at least 200° C. to fully cure the film so that it does not interact with said photoresist.

13. The method of claim 1 wherein the BARC preferably has a thickness from about 300 Angstroms to about 1000 Angstroms.

14. The method of claim 1 wherein the trench pattern is transferred through the passivation layer and into said dielectric layer.

15. The method of claim 14 further comprised of:
removing the remaining resin layer in said via hole and the remaining organic layers in said second stack;
removing said etch stop layer exposed at the bottom of said via hole; and
depositing a metal and planarizing to form a metal surface that is coplanar with said passivation layer.

16. The method of claim 15 further comprising the deposition of a barrier metal layer such as TiN in the via hole and trench prior to the deposition of said metal layer.

17. A damascene method comprising:
providing a substrate with a stack of layers formed thereon, said stack comprised of a lower etch stop layer, a middle dielectric layer, and an upper passivation layer wherein one or more of said layers is comprised of a nitrogen containing compound;
forming a via hole in said passivation and dielectric layers;
forming a barrier layer on said passivation layer, said barrier layer also filling said via hole;
coating and baking a BARC on said barrier layer, said barrier layer being made from a material that is different from the material of said BARC and the material of said passivation layer;
coating and baking a photoresist on said BARC;
patterning said photoresist to form a trench; and
transferring said pattern into at least a portion of said stack of layers.

18. The method of claim 17 wherein said etch stop layer is selected from a group including silicon carbide, silicon nitride, and silicon oxynitride.

19. The method of claim 17 wherein said passivation layer is selected from a group of materials including oxides and nitrides and is preferably $SiO_xN_y$.

20. The method of claim 17 wherein said dielectric layer is selected from a group of materials including $SiO_2$, carbon doped $SiO_2$, polyimides, polysilsesquioxanes, polyarylethers, and fluorosilicate glass.

21. The method of claim 17 wherein said resin is selected from a group of materials including organic and inorganic polymers.

22. The method of claim 17 wherein said barrier layer is spin coated and baked at a temperature equal to or above the processing temperatures of the overlying BARC and photoresist layers.

23. The method of claim 17 wherein said barrier layer is an i-line photoresist or a Deep UV photoresist comprised of a polymer having hydroxyl groups.

24. The method of claim 23 wherein said photoresist is a positive tone or negative tone photoresist.

25. The method of claim 17 wherein said barrier layer forms a thickness of about 50 to 5000 Angstroms above said passivation layer.

26. The method of claim 17 wherein the BARC and photoresist are selected for patterning with an exposure wavelength that is preferably sub-200 nm.

27. The method of claim 26 wherein the BARC is baked at a temperature of at least 200° C. to fully cure the film so that it does not interact with said photoresist.

28. The method of claim 17 wherein the BARC preferably has a thickness from about 300 Angstroms to about 1000 Angstroms.

29. The method of claim 28 further comprised of:
removing the remaining barrier layer in said via hole and the remaining organic layers on said passivation layer;
removing said etch stop layer exposed at the bottom of said via hole; and
depositing a metal and planarizing to form a metal surface that is coplanar with said passivation layer.

30. The method of claim 29 further comprising the deposition of a barrier metal layer such as TiN in the via hole and trench prior to the deposition of said metal layer.

31. The method of claim 17 wherein the trench pattern is transferred through the passivation layer and into said dielectric layer.

* * * * *